(12) United States Patent
Fujimoto et al.

(10) Patent No.: US 6,920,570 B2
(45) Date of Patent: Jul. 19, 2005

(54) LEVEL SHIFTER CONTROL CIRCUIT WITH DELAYED SWITCHOVER TO LOW-POWER LEVEL SHIFTER

(75) Inventors: Syuichiro Fujimoto, Miyazaki (JP); Yoshiro Himeno, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 677 days.

(21) Appl. No.: 09/860,521

(22) Filed: May 21, 2001

(65) Prior Publication Data

US 2002/0083352 A1 Jun. 27, 2002

(30) Foreign Application Priority Data

Dec. 22, 2000 (JP) .......................................... 2000-389847

(51) Int. Cl.[7] .......................... G06F 1/26; H03K 9/0175; G11C 7/00
(52) U.S. Cl. .................. 713/300; 713/310; 365/189.11; 326/80
(58) Field of Search ....................... 326/68, 80; 713/300; 365/189.11

(56) References Cited

U.S. PATENT DOCUMENTS

| | | | | |
|---|---|---|---|---|
| 5,483,176 A | * | 1/1996 | Rodriguez et al. | 326/21 |
| 5,483,489 A | * | 1/1996 | McClure | 365/189.11 |
| 5,612,892 A | * | 3/1997 | Almulla | 716/6 |
| 5,659,258 A | * | 8/1997 | Tanabe et al. | 326/68 |
| 5,705,946 A | * | 1/1998 | Yin | 327/333 |
| 5,751,642 A | * | 5/1998 | Yoo | 365/189.06 |
| 5,764,082 A | * | 6/1998 | Taylor | 326/81 |
| 6,011,421 A | * | 1/2000 | Jung | 327/333 |
| 6,147,539 A | * | 11/2000 | Almulla | 327/333 |
| 6,255,857 B1 | * | 7/2001 | Iliasevitch | 326/130 |
| 6,437,627 B1 | * | 8/2002 | Tran et al. | 327/333 |
| 6,477,092 B2 | * | 11/2002 | Takano | 365/189.11 |
| 6,724,363 B1 | * | 4/2004 | Satoh et al. | 345/100 |

\* cited by examiner

Primary Examiner—Chun Cao
(74) Attorney, Agent, or Firm—Volentine Francos & Whitt, PLLC

(57) ABSTRACT

A level shifter control circuit selects one of two level shifters for converting a signal output from a circuit operating on a first power supply for input to a circuit operating on a second power supply. A low-power level shifter is selected when the difference between the two power-supply potentials is comparatively small. A wide-range level shifter is selected when the difference is greater. The switchover from the wide-range level shifter to the low-power level shifter is delayed to allow the power-supply potential difference to diminish to within the operating range of the low-power level shifter, thereby avoiding gaps in the level-shifted signal.

11 Claims, 8 Drawing Sheets

LEVEL SHIFTER CONTROL CIRCUIT WITH DELAYED SWITCHOVER TO LOW-POWER LEVEL SHIFTER

BACKGROUND OF THE INVENTION

The present invention relates to a level shifter control circuit that selects different level shifters to perform level shifts of different sizes.

The invention is useful in, for example, an integrated circuit having circuit blocks that operate at different power-supply potentials, at least one of which is variable. One example is an integrated circuit having internal circuit blocks operating at a very low internal power-supply potential, and interface circuit blocks operating at an external power-supply potential that is normally much higher than the internal power-supply potential, but is reduced to a level near the internal power-supply potential when the integrated circuit operates in a low-power mode. Logic signals output by the internal circuit blocks must be up-shifted for input to the interface circuit blocks; that is, their high logic level must be raised from the internal power-supply potential to the external power-supply potential. The level shifters that normally perform this job have a wide operating range, but consume considerable current during signal transitions. In the low-power mode, it is desirable to use low-power level shifters that have a narrower operating range but consume less current.

The integrated circuit accordingly includes two different types of level shifters, a wide-range type and a low-power type, and has a level shifter control circuit that selects one type of level shifter or the other according to the difference between the internal and external power-supply potentials. The wide-range type is selected when the difference is large; the low-power type is selected when the difference is small.

A switchover from the low-power type of level shifter to the wide-range type causes no problems, because the wide-range type is immediately able to perform the necessary level shift. In a switchover from the wide-range type to the low-power type, however, the low-power type of level shifter may be initially unable to operate, because of the still-large difference between the two power-supply potentials. There may accordingly be a hiatus during which communication from the internal circuit blocks to the interface circuit blocks is interrupted, until the external power-supply potential falls to within the operating range of the low-power level shifters.

A more detailed description of this problem will be given in the detailed description of the invention.

SUMMARY OF THE INVENTION

An object of the present invention is to provide continuous output of a level-shifted signal during a switchover from one type of level shifter to a lower-power type.

The invention provides a method of selecting a first level shifter or a second level shifter to convert a signal compatible with a first power-supply potential to a signal compatible with a second power-supply potential, where the first level shifter consumes less power than the second level shifter. The method includes the following steps:

(a) receiving a selection signal;

(b) switching from the first level shifter to the second level shifter when the selection signal changes from a first level to a second level; and (c) switching from the second level shifter to the first level shifter after the selection signal changes from the second level to the first level.

The switchover in the third step (c) may be performed when a predetermined time has elapsed after the selection signal changes from the second level to the first level. Alternatively, the switchover in the third step (c) may be performed when the second power-supply potential reaches a predetermined level. The third step (c) may be carried out by generating a delayed selection signal. The delayed selection signal is brought to the second level while the selection signal is still at the second level, and set to the first level after the selection signal has changed to the first level. The first level shifter is selected according to the delayed selection signal.

The invention also provides level shifter control circuits embodying the methods above. To generate the delayed selection signal, one level shifter control circuit uses a resettable flip-flop, a counter, and a reset circuit; another uses a resettable flip-flop, an integrating circuit, and a reset circuit; yet another uses a microcontroller unit; and still another uses a comparator.

DETAILED DESCRIPTION OF THE INVENTION

Several level shifter control circuits will now be described with reference to the attached drawings, in which like parts are indicated by like reference characters. The drawings will illustrate both conventional and novel level shifter control circuits.

Figure 1:
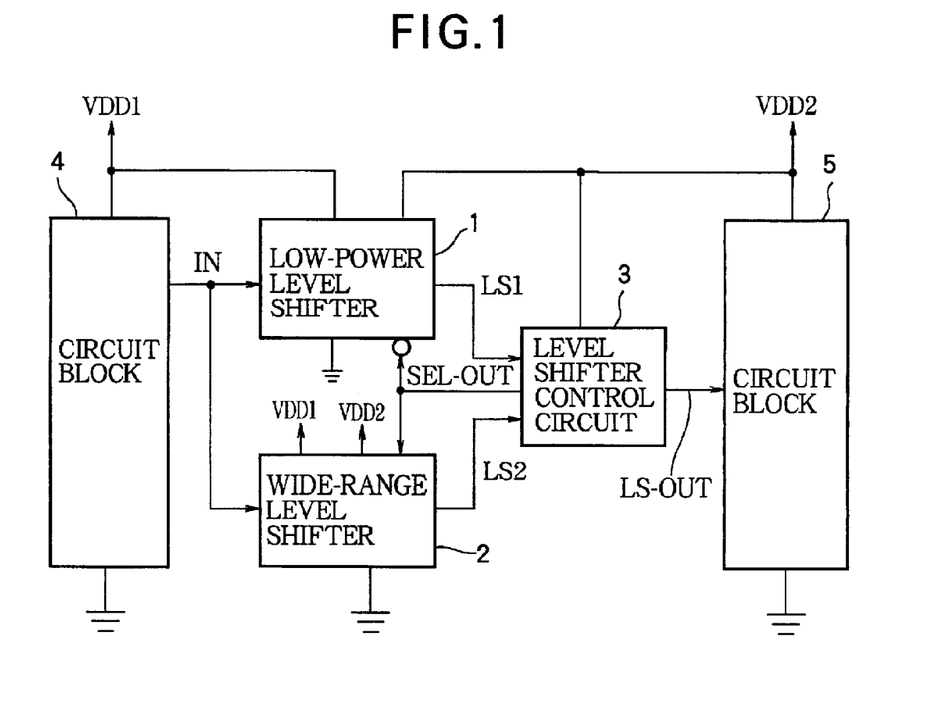
FIG. 1 is a block diagram showing a level shifter control circuit and associated circuits.

FIG. 1 is a block diagram showing part of an integrated circuit that operates on two power supplies VDD1 and VDD2. The illustrated part includes a low-power level shifter 1, a wide-range level shifter 2, and a level shifter control circuit 3 disposed between a circuit block 4 operating on VDD1 and another circuit block 5 operating on VDD2. Power supply VDD1 is supplied to both level shifters 1, 2 and circuit block 4. Power supply VDD2 is supplied to both level shifters 1, 2, the level shifter control circuit 3, and circuit block 5.

The level shifters 1, 2 are up-shifters that shift a signal (IN) received from circuit block 4 from logic levels compatible with power supply VDD1 to logic levels compatible with power supply VDD2, for input to circuit block 5. The up-shifted signals are denoted LS1 and LS2, respectively. The level shifter control circuit 3 selects one of the two level shifters 1, 2 according to input selection signals (not visible), generates an output selection signal (SEL-OUT) that enables the selected level shifter and disables the non-selected level shifter, receives the output signal of the selected level shifter (LS1 or LS2), and supplies a corresponding level-shifted output signal (LS-OUT) to circuit block 5.

The above-mentioned selection signals are controlled so that when the potential difference between power supply VDD1 and power supply VDD2 is within the operating range of the low-power level shifter 1, the level shifter control circuit 3 selects the low-power level shifter 1. When the power-supply potential difference is not within the operating range of the low-power level shifter 1, the wide-range level shifter 2 is selected.

Figure 2:
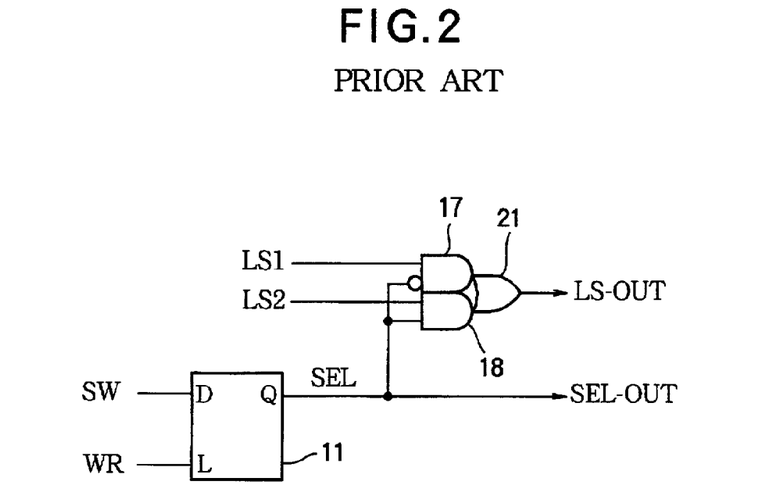
FIG. 2 is a circuit diagram of a conventional level shifter control circuit.

A circuit diagram of a conventional level shifter control circuit is shown in FIG. 2. The circuit includes a register 11, a pair of AND gates 17, 18, and an OR gate 21. The inputs to this control circuit are the output signal LS1 of the low-power level shifter 1 (when selected), the output signal LS2 of the wide-range level shifter 2 (when selected), a switching signal SW, and a write signal WR. The switching signal and write signal are the selection signals mentioned above. If the level shifter control circuit is part of an integrated circuit that also includes a power management circuit, the switching signal and write signal may be generated by the power management circuit. If the level shifter control circuit is integrated with a microcontroller in, for example, a so-called system on a chip, the switching signal and write signal may be generated by the microcontroller.

The register 11 has a data input terminal (D) that receives the switching signal SW, a latch clock input terminal (L) that receives the write signal WR, and a data output terminal (Q) from which the output selection signal SEL-OUT is obtained. The switching input signal SW is latched on the rising edge of the write signal WR, thus becoming the output selection signal SEL-OUT. Where selection-signal levels and timings are discussed below, 'level' will mean the logic level (high or low) of the switching signal SW or the latched selection signal, and 'selection signal transition timing' will refer to the timing at which the switching signal is latched; that is, to the rising-edge timing of the write signal WR. The latched switching signal output by the register 11 will also be referred to as a selection signal SEL.

AND gate 17 has an inverting input terminal that receives the selection signal SEL output by the register 11. That is, the selection signal SEL is inverted at this input terminal. AND gate 18 receives the non-inverted selection signal, which is also supplied to the level shifters 1, 2. The second input to AND gate 17 is the output signal LS1 of the low-power level shifter 1. The second input to AND gate 18 is the output signal LS2 of the wide-range level shifter 2. The output signals generated by the two AND gates 17, 18 are supplied as inputs to the OR gate 21. The output signal of the OR gate 21 is the level-shifted output signal LS-OUT supplied to circuit block 5 in FIG. 1.

When the selection signal SEL output by the register 11 is low (at the low logic level or ground level), the low-power level shifter 1 is enabled, the wide-range level shifter 2 is disabled, and the level-shifted output signal LS-OUT is generated by the AND gates 17, 18 and OR gate 21 from the output signal LS1 of the low-power level shifter 1. When the selection signal SEL output by the register 11 is high (at the high logic level or VDD2 level), the low-power level shifter 1 is disabled, the wide-range level shifter 2 is enabled, and the level-shifted output signal LS-OUT is generated by the AND gates 17, 18 and OR gate 21 from the output signal LS2 of the wide-range level shifter 2.

Figure 3:
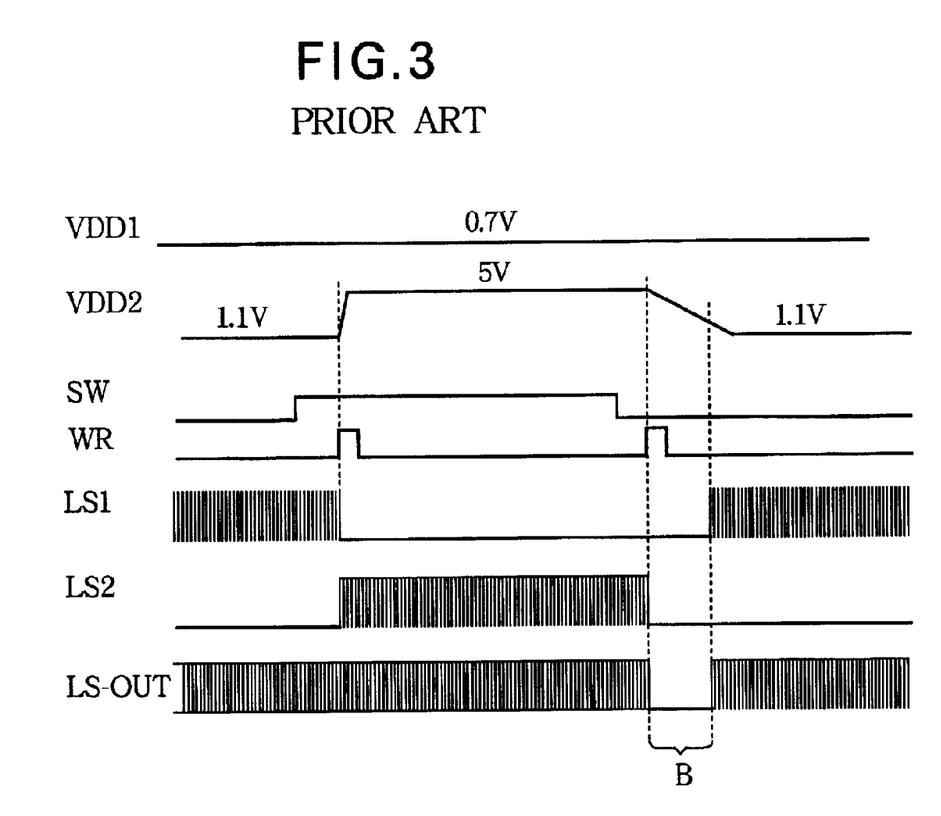
FIG. 3 is a timing diagram illustrating the operation of the level shifter control circuit in FIG. 2.

The operation of this conventional level shifter control circuit is illustrated in FIG. 3, which shows waveforms of the two power supplies VDD1, VDD2, the switching signal SW, the write signal WR, the output signal LS1 of low-power level shifter 1, the output signal LS2 of the wide-range level shifter 2, and the output signal LS-OUT of the level shifter control circuit. Power supply VDD1 has a fixed potential of 0.7 volts. Power supply VDD2 is switched between 1.1-volt and 5-volt potential levels. The low-power level shifter 1 is selected when VDD2 is 1.1 volts. The wide-range level shifter 2 is selected when VDD2 is five volts.

In the integrated circuit of which the level shifter control circuit is a part, when power supply VDD2 changes from 1.1 volts to five volts, first the switching signal SW is switched from the low to the high logic level; then the write signal WR goes high, coincident with the beginning of the rise of VDD2. The register 11 latches the high switching signal SW at the rising transition of the write signal WR, changing the output selection signal SEL-OUT from low to high. The low-power level shifter 1 is then disabled, the wide-range level shifter 2 is enabled, and the AND gates 17, 18 and OR gate 21 select the output signal LS2 of the wide-range level shifter 2.

When power supply VDD2 changes from five volts to 1.1 volts, first the switching signal SW is switched from the high to the low logic level; then the write signal WR goes high at the instant when VDD2 starts to fall. The low switching signal SW is latched at the rising transition of the write signal WR, changing the output selection signal SEL-OUT from high to low. The wide-range level shifter 2 is then disabled, the low-power level shifter 1 is enabled, and the AND gates 17, 18 and OR gate 21 select the output signal LS1 of the low-power level shifter 1.

Figure 4:
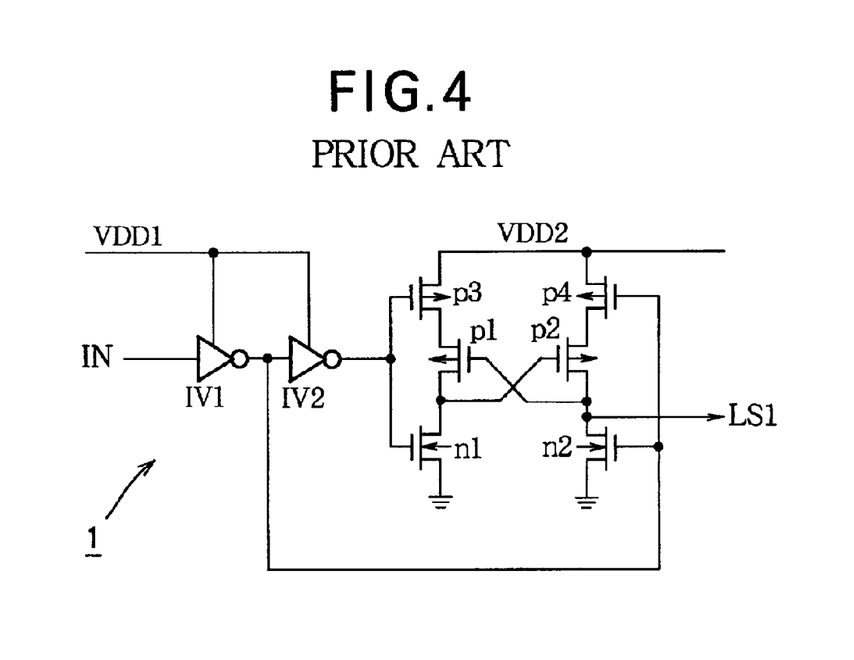
FIG. 4 is a circuit diagram of the low-power level shifter in FIG. 1.
Figure 5:
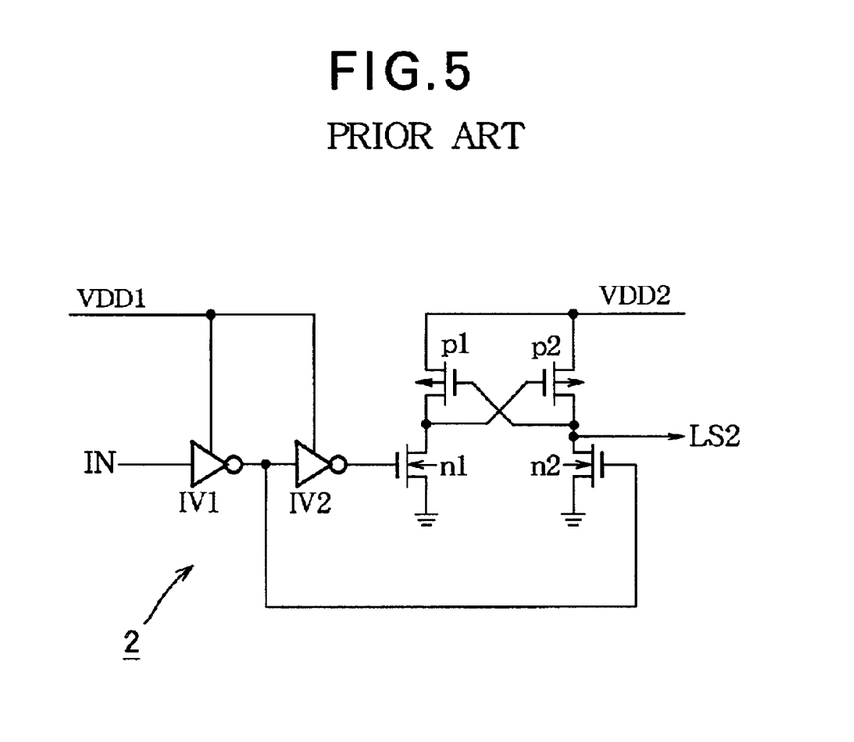
FIG. 5 is a circuit diagram of the wide-range level shifter in FIG. 1.

Circuit diagrams of the two level shifters 1, 2 are shown in FIGS. 4 and 5. Similar elements in these diagrams are identified by the same reference characters. For simplicity, the selection signal SEL-OUT and the associated circuit elements that enable and disable the level shifters are omitted.

The wide-range level shifter 2, shown in FIG. 5, includes a pair of inverters IV1, IV2, a pair of n-channel metal-oxide-semiconductor (NMOS) transistors n1, n2, and a pair of p-channel metal-oxide-semiconductor (PMOS) transistors p1, p2. The signal IN obtained from circuit block 4 in FIG. 1 is inverted by inverter IV1. The output signal of inverter IV1 is inverted by inverter IV2. The power supply of these inverters is VDD1. The output signals of inverters IV1, IV2 are supplied to the gate electrodes of NMOS transistors n2, n1, respectively. The source electrodes of both NMOS transistors n1, n2 are grounded. The drain electrode of NMOS transistor n1 is coupled to the drain electrode of PMOS transistor p1 and the gate electrode of PMOS transistor p2. The drain electrode of NMOS transistor n2 is coupled to the drain electrode of PMOS transistor p2 and the gate electrode of PMOS transistor p1. The source electrodes of both PMOS transistors p1, p2 are coupled to power supply VDD2. Output signal LS2 is taken from a node at which the drain electrodes of PMOS transistor p2 and NMOS transistor n2 are interconnected.

When the input signal IN is low (at ground level), transistors n2 and p1 are in the on-state, transistors n1 and p2 are in the off-state, and the output signal LS2 is low. When the input signal IN is high (at the VDD1 level), transistors n1 and p2 are in the on-state, transistors n2 and p1 are in the off-state, and the output signal LS2 is high (at the VDD2 level).

The low-power level shifter 1 in FIG. 4 adds another pair of PMOS transistors p3, p4 to the circuit in FIG. 5. Transistor p3 is inserted in series between transistor p1 and power supply VDD2; that is, its source electrode is coupled to power supply VDD2 and its drain electrode is coupled to the source electrode of transistor p1. Transistor p4 is similarly inserted in series between transistor p2 and power supply VDD2. The gate electrode of transistor p4 receives the output signal of inverter IV1. The gate electrode of transistor p3 receives the output signal of inverter IV2.

In the low-power level shifter 1, when the input signal IN is low, transistors n2, p1, and p3 are in the on-state, transistors n1, p2, and p4 are in the off-state, and the output signal LS2 is low. When the input signal IN is high, transistors n1, p2, and p4 are in the on-state, transistors n2, p1, and p3 are in the off-state, and the output signal LS2 is high (at the VDD2 level). In these operations, transistors p3 and p4 do not turn completely off (because their gate-source voltage in the off-state is not zero but is equal to the difference between VDD1 and VDD2), but these transistors act as loads, limiting the flow of current during switchovers, when the other four transistors n1, n2, p1, p2 are all in transition between the on and off states.

The conventional level shifter control circuit in FIG. 2 experiences a problem in switching between the two level shifters 1, 2 when power supply VDD2 falls from the 5-volt level to the 1.1-volt level. Referring again to FIG. 3, the fall takes place comparatively slowly, and during the fall, there is a hiatus B in the output signal LS-OUT. The reason for the hiatus is as follows.

When the difference (VDD2−VDD1) between the two power-supply potentials exceeds the threshold level of PMOS transistors p3, p4, these transistors are always in the on-state, and fail to provide a current-limiting effect. The low-power level shifter 1 must therefore be configured (by circuit elements not shown FIG. 4) so that it cannot be enabled when the difference between the two power-supply potentials exceeds the threshold level of transistors p3, p4. During most of the interval while VDD2 is falling, the low-power level shifter 1 therefore remains disabled. The wide-range level shifter 2 is also disabled, starting from the selection signal transition timing, so both level shifters are disabled during the interval B until the difference between the two power-supply potentials is reduced to approximately the threshold level of transistors p3, p4.

This problem does not occur during the rise of VDD2 from 1.1 volts to five volts, because the low-power level shifter 1 is disabled and the wide-range level shifter 2 is enabled simultaneously at the rising edge of the write signal WR.

Figure 6:
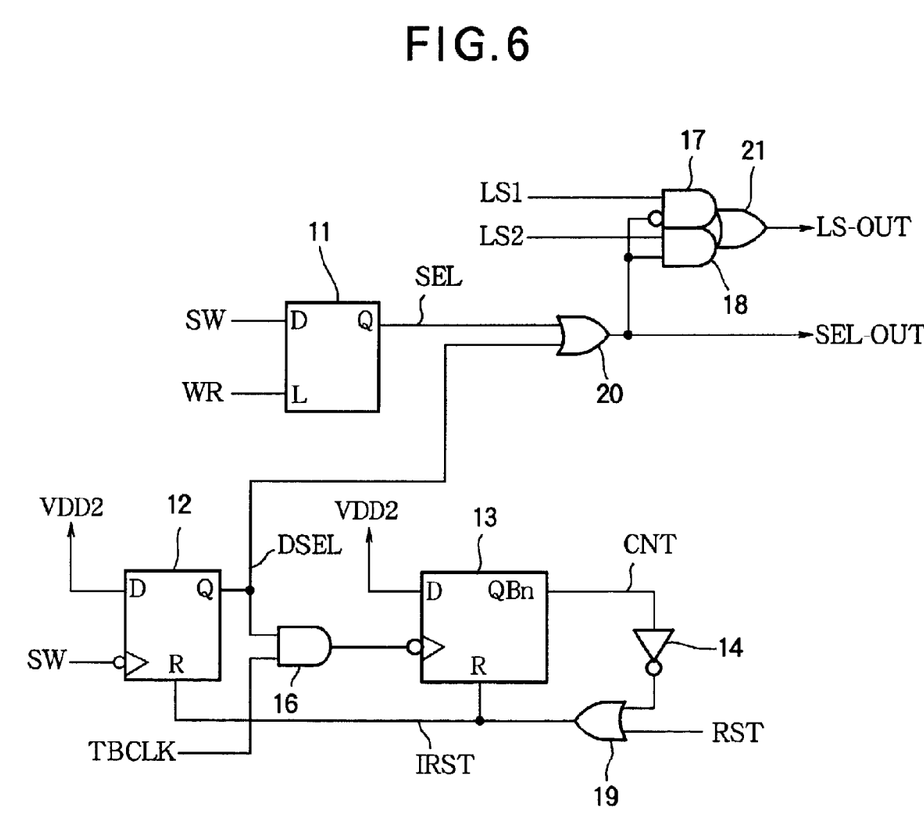
FIG. 6 is a circuit diagram of a level shifter control circuit embodying the invention.

As a first embodiment of the invention, FIG. 6 shows a level shifter control circuit comprising a register 11, a D-type flip-flop circuit 12, a counter circuit 13, a delay circuit 14, AND gates 16, 17, 18, and OR gates 19, 20, 21. The input signals to this level shifter control circuit are the output signal LS1 of the low-power level shifter 1 (when selected), the output signal LS2 of the wide-range level shifter 2 (when selected), the switching signal SW and write signal WR described above, a time-base clock signal TBCLK, and a system reset signal RST. The time-base clock signal is, for example, a comparatively low-frequency oscillator signal used as a time base for a real-time clock function, or more generally any signal that alternates between the high and low logic levels at regular intervals. The time-base clock signal, the system reset signal, and the selection signals SW and WR are generated by, for example, other functional blocks in the integrated circuit of which the level shifter control circuit forms a part.

Detailed descriptions of the register 11, AND gates 17, 18, and OR gate 21 will be omitted, as these elements are similar to the corresponding elements in the conventional level shifter control circuit.

The D-type flip-flop circuit 12 has a clock input terminal that receives the switching signal SW, a data input terminal (D) tied to power supply VDD2 (the high logic level), a reset input terminal (R) that receives an internal reset signal IRST, and a data output terminal (Q) from which a delayed selection signal DSEL is output. The delayed selection signal DSEL goes low at the rising edge of the internal reset signal IRST, then goes high when the VDD2 potential is latched at the next rising edge of the switching signal SW.

AND gate 16 receives the delayed selection signal DSEL and the time-base clock signal TBCLK, and supplies their logical AND to the counter circuit 13. AND gate 16 thus supplies a clock signal (TBCLK) to the counter circuit 13 when the delayed selection signal DSEL is high.

The counter circuit 13 has a clock input terminal that receives this clock signal from AND gate 16, a data input terminal (D) tied to power supply VDD2, a reset input terminal (R) that receives the internal reset signal IRST, and an inverting output terminal (QBn) from which a count signal CNT is obtained. The count signal CNT is reset to the high logic level at the rising edge of the internal reset signal IRST. Thereafter, the counter circuit 13 counts falling edges of the clock signal input from AND gate 16 and operates as a frequency divider, dividing the frequency of the input clock signal by $2^n$ to generate the count signal CNT, where n is an integer equal to or greater than two.

The counter circuit 13 actually has a plurality of non-inverting output terminals Q1, Q2, ..., Qn, Qn+1, ... and inverting output terminals QB1, QB2, ..., QBn, QBn+1, ..., providing a selection of inverted and non-inverted count signals in which the input clock frequency is divided by factors of $2^1, 2^2, \ldots, 2^n, 2^{n+1}, \ldots$. For simplicity, only output terminal QBn is shown in the drawing.

The delay circuit 14 inverts the count signal CNT, adding a comparatively long propagation delay D when CNT goes low and a preferably shorter propagation delay when CNT goes high, and supplies the inverted signal to OR gate 19. OR gate 19 also receives the system reset signal RST. The output of OR gate 19 is the internal reset signal IRST supplied to the D-type flip-flop circuit 12 and counter circuit 13.

The purpose of the delay circuit 14 is to provide an extra delay in the resetting of the flip-flop circuit 12 and counter circuit 13. If this extra delay is not needed, the delay circuit 14 can be omitted, the count signal CNT can be taken from a non-inverting output terminal Qn (not visible) of the counter circuit 13, and this non-inverted count signal can be supplied directly to OR gate 19.

OR gate 20 receives the selection signal SEL output by the register 11 and the delayed selection signal DSEL output by the D-type flip-flop circuit 12, and generates the output selection signal SEL-OUT that is supplied to AND gates 17, 18 and level shifters 1, 2. When SEL-OUT is low, the low-power level shifter 1 is enabled, the wide-range level shifter 2 is disabled, and the AND gates 17, 18 and OR gate 21 select the output signal LS1 of the low-power level shifter 1 as the output signal LS-OUT to be supplied to circuit block 5 in FIG. 1. When SEL-OUT is high, the low-power level shifter 1 is disabled, the wide-range level shifter 2 is enabled, and the AND gates 17, 18 and OR gate 21 select the output signal LS2 of the wide-range level shifter 2 as LS-OUT.

Figure 7:
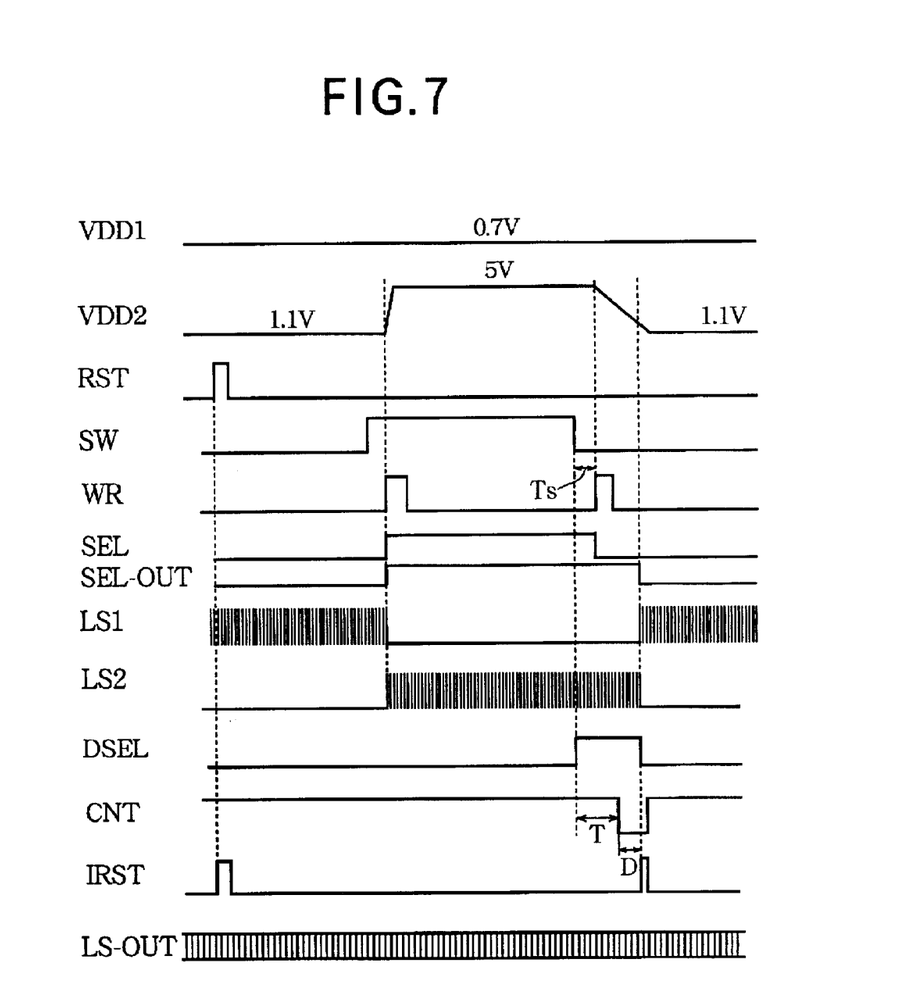
FIG. 7 is a timing diagram illustrating the operation of the level shifter control circuit in FIG. 6.

The operation of the level shifter control circuit in FIG. 6 will be described with reference to the timing diagram in FIG. 7, which shows waveforms of the power supplies VDD1, VDD2, the system reset signal RST, the switching signal SW, the write signal WR, the selection signal SEL output by the register 11, the output selection signal SEL-OUT generated by OR gate 20, the output signals LS1, LS2 of the two level shifters, the delayed selection signal DSEL output by the D-type flip-flop circuit 12, the count signal CNT output by the counter circuit 13, the internal reset signal IRST, and the level-shifted output signal LS-OUT. As before, power supply VDD1 has a fixed potential of 0.7 volts, power supply VDD2 switches between 1.1 volts and five volts, the low-power level shifter 1 is selected when VDD2 is 1.1 volts, and the wide-range level shifter 2 is selected when VDD2 is five volts.

At power-up or a system reset, the system reset signal RST goes high. The internal reset signal IRST is driven high by OR gate 19, resetting the D-type flip-flop circuit 12 and counter circuit 13, so the delayed selection signal DSEL is low and the count signal CNT is high. The system reset also a resets the register 11, so the selection signal SEL is low. The output selection signal SEL-OUT is therefore low. In this state, the low-power level shifter 1 is enabled, the wide-range level shifter 2 is disabled, and the output signal LS1 of the low-power level shifter 1 is selected by AND gates 17, 18 and OR gate 21 as the level-shifted output signal LS-OUT. Power supply VDD2 is at the 1.1-volt level at this time.

After a while, the switching signal SW goes high, indicating an impending rise of VDD2 from 1.1 volts to five volts. When VDD2 begins to rise, the write signal WR also rises, causing the register 11 to latch the high switching signal SW. The selection signal SEL output by the register 11 now goes high, so the output selection signal SEL-OUT output by OR gate 20 goes high, disabling the low-power level shifter 1, enabling the wide-range level shifter 2, and causing the AND gates 17, 18 and OR gate 21 to select the output signal LS2 of the wide-range level shifter 2 as the level-shifted output signal LS-OUT.

Later on, the switching signal SW goes low again, indicating an impending return of VDD2 from five volts to 1.1 volts. At the falling edge of the switching signal SW, the D-type flip-flop circuit 12 latches its high data input, and the delayed selection signal DSEL output by the D-type flip-flop circuit 12 goes high. The counter circuit 13 now begins to receive and count time-base clock signals.

Shortly thereafter, VDD2 begins to fall and the write signal WR goes high again. The register 11 latches the low switching signal SW, and selection signal SEL goes low, but the delayed selection signal DSEL remains high, so the output selection signal SEL-OUT also remains high. The level shifter control circuit continues to enable the wide-range level shifter 2 and select its output signal LS2 as the level-shifted output signal LS-OUT.

After a time T equivalent to $2^n$ cycles of the time-base clock signal, the count signal CNT generated by the counter circuit 13 goes low. Following the propagation delay D in the delay circuit 14, the internal reset signal IRST goes high, resetting the D-type flip-flop circuit 12 and counter circuit 13. The delayed selection signal DSEL is therefore reset to the low level, causing the output selection signal SEL-OUT to go low. The level shifter control circuit now disables the wide-range level shifter 2, enables the low-power level shifter 1, and selects its output signal LS1 as the level-shifted output signal LS-OUT.

When the counter circuit 13 is reset, the count signal CNT goes high again. The internal reset signal IRST then goes low, leaving the level shifter control circuit ready to deal with further VDD2 transitions.

During the interval (T+D) from the fall of the switching signal SW to the rise of the internal reset signal IRST, the potential of power supply VDD2 falls from five volts to a level within the operating range of the low-power level shifter 1. This fall actually takes place in the shorter interval (T+D−Ts) from the rise of the write signal WR to the rise of the internal reset signal IRST (Ts is the time from the SW transition to the WR transition). If the delay circuit 14 is omitted, the interval becomes still shorter (T−Ts). The delay circuit 14 can be omitted if this shorter interval (T−Ts) is long enough for VDD2 to reach the operating range of the low-power level shifter 1.

The length of the interval (T+D−Ts, or T−Ts) depends on the frequency of the time-base clock signal and the value of n; that is, on the time-base clock frequency and the particular output terminal of the counter circuit 13 from which the count signal CNT is taken. The value of n (the output terminal of the counter circuit 13) should be selected according to the time-base clock frequency, so as to ensure that sufficient time is allowed for VDD2 to reach the operating range of the low-power level shifter 1 before the low-power level shifter 1 is enabled and its output signal LS1 is selected. The hiatus B noted in FIG. 3 is then eliminated. Circuit block 5 receives a level-shifted output signal LS-OUT continuously during both the rise and fall of the VDD2 potential.

In the level shifter control circuit in FIG. 6, the D-type flip-flop circuit 12, counter circuit 13, delay circuit 14, AND gate 16, and OR gate 19 constitute a signal generating unit generating a delayed selection signal DSEL that goes high while the selection signal SEL is still high preceding a transition that causes the potential of power supply VDD2 to fall, and goes low after the elapse of a time T+D−Ts (or T−Ts) from when the selection signal SEL goes low at this transition. AND gates 17, 18 and OR gates 20, 21 constitute a switching unit that switches from the low-power level shifter 1 to the wide-range level shifter 2 when the selection signal SEL changes from low to high, and switches from the wide-range level shifter 2 to the low-power level shifter 1 when the delayed selection signal DSEL changes from high to low.

The first embodiment thus uses a D-type flip-flop circuit 12 and a counter circuit 13 to generate a delayed selection signal DSEL, and switches over from the wide-range level shifter 2 to the low-power level shifter 1 when the delayed selection signal DSEL goes low, following the elapse of a time T+D−Ts (or T−Ts) from the high-to-low transition of the selection signal SEL, giving the potential of power supply VDD2 adequate time to reach a level within the operating range of the low-power level shifter 1. An uninterrupted level-shifted output signal LS-OUT is therefore obtained.

Figure 8:
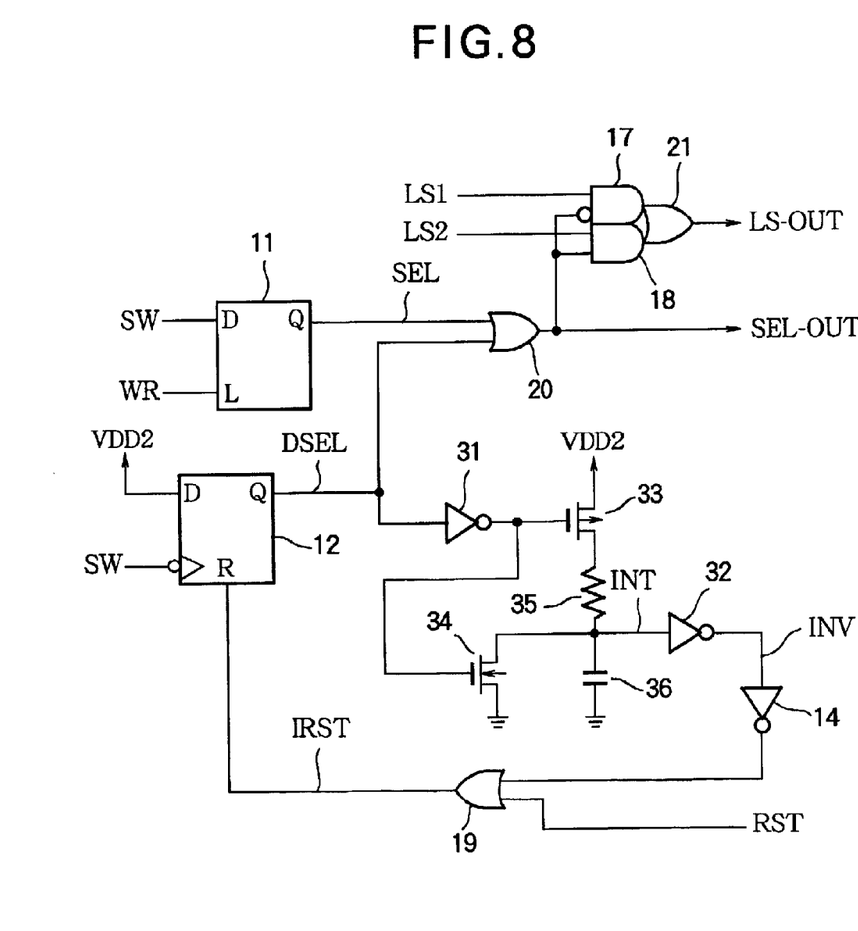
FIG. 8 is a circuit diagram of another level shifter control circuit embodying the invention.

As a second embodiment of the invention, FIG. 8 shows a level shifter control circuit comprising a register 11, a D-type flip-flop circuit 12, a delay circuit 14, AND gates 17, 18, OR gates 19, 20, 21, a pair of inverters 31, 32, a PMOS transistor 33, an NMOS transistor 34, a resistor 35, and a capacitor 36. The inverters 31, 32, PMOS transistor 33, NMOS transistor 34, resistor 35, and capacitor 36 replace the counter circuit 13 and AND gate 16 of the first embodiment. The other elements in FIG. 8 and their input and output signals are identical to the corresponding elements and signals in FIG. 6.

The delayed selection signal DSEL output from the D-type flip-flop circuit 12 is supplied to OR gate 20 and inverter 31. The output signal of inverter 31 is supplied to the gate electrodes of the PMOS transistor 33 and NMOS transistor 34. The source electrode of the PMOS transistor 33 is coupled to power supply VDD2. The drain electrode of the PMOS transistor 33 is coupled to one terminal of the resistor 35. The other terminal of the resistor 35 is coupled to one terminal of the capacitor 36, at a node from which an integrated voltage signal INT is output to inverter 32. This node is also coupled to the drain electrode of the NMOS transistor 34. The source electrode of the NMOS transistor 34 is coupled to ground, as is the other terminal of the capacitor 36. The output signal INV of inverter 32 is supplied to the delay circuit 14.

The resistor 35 and capacitor 36 form a resistance-capacitance (RC) integrating circuit. The PMOS transistor 33 functions as an enabling transistor; the integration operation starts when this transistor turns on. The NMOS transistor 34 functions as an initializing transistor; the integration operation is initialized when this transistor turns on. Initialization means that the capacitor 36 is discharged and the integrated voltage signal INT is reset to the low (ground) level.

As in the first embodiment, the delay circuit 14 may be omitted, in which case inverter 32 should either be omitted, or replaced by two inverters coupled in series.

Figure 9:
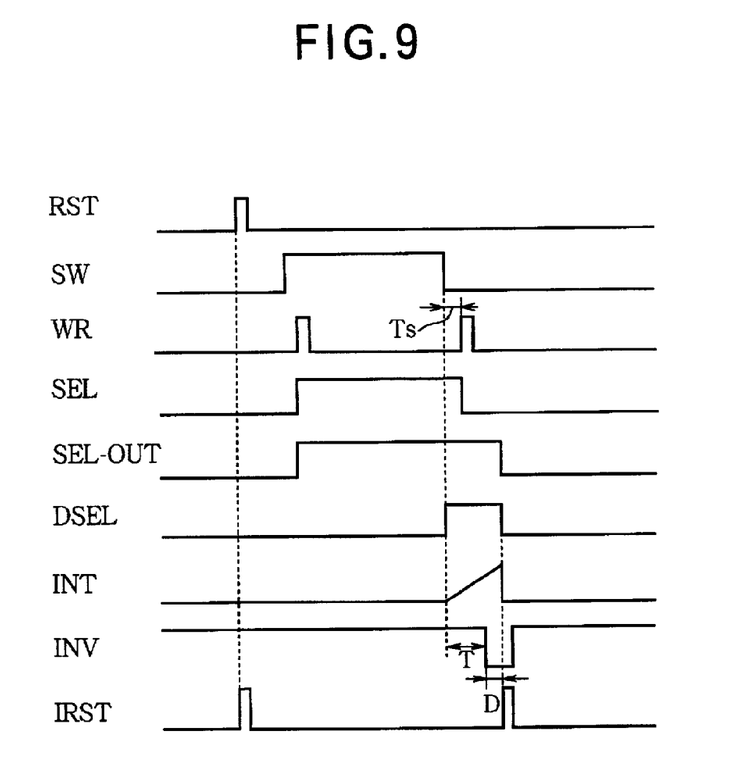
FIG. 9 is a timing diagram illustrating the operation of the level shifter control circuit in FIG. 8.

The operation of the second embodiment will be described with reference to the timing diagram in FIG. 9, which shows waveforms of the system reset signal RST, switching signal SW, write signal WR, selection signal SEL, output selection signal SEL-OUT, delayed selection signal DSEL, integrated voltage signal INT, inverted signal INV, and internal reset signal IRST. Waveforms of the power supply voltages VDD1, VDD2 are omitted since they are the same as in FIG. 7; that is, VDD1 remains constant at 0.7 volts, while VDD2 is initially 1.1 volts, then rises to five volts, then returns to 1.1 volts.

At power-up or a system reset, the system reset signal RST and internal reset signal IRST go high, resetting the D-type flip-flop circuit 12, so the delayed selection signal DSEL is low. The output of inverter 31 is therefore high, PMOS transistor 33 is in the off-state, and NMOS transistor 34 is in the on-state, holding the integrated voltage signal INT at the low level and the inverted signal INV at the high level. The system reset also resets the register 11, so the selection signal SEL is low. Since both SEL and DSEL are low, the output selection signal SEL-OUT is also low. In this state, the low-power level shifter 1 is enabled, the widerange level shifter 2 is disabled, and the output signal LS1 of the low-power level shifter 1 is selected by AND gates 17, 18 and OR gate 21 as the level-shifted output signal LS-OUT. Power supply VDD2 is at the 1.1-volt level at this time.

After a while, the switching signal SW goes high, indicating an impending rise of VDD2 from 1.1 volts to five volts. When this rise begins, the write signal WR also rises, the register 11 latches the switching signal SW, the selection signal SEL goes high, and the output selection signal SEL-OUT goes high, disabling the low-power level shifter 1, enabling the wide-range level shifter 2, and causing the output signal LS2 of the wide-range level shifter 2 to be selected, as described in the first embodiment.

Later on, the switching signal SW goes low again, indicating an impending return of VDD2 from five volts to 1.1 volts, and causing the delayed selection signal DSEL output by the D-type flip-flop circuit 12 to go high. The output of inverter 31 therefore goes low, turning PMOS transistor 33 on and NMOS transistor 34 off, thereby enabling the RC integrating circuit and starting the integration operation. At this point the integrated voltage signal INT begins to rise.

Shortly thereafter, when VDD2 begins to fall, the write signal WR goes high and the selection signal SEL output from the register 11 goes low, but the delayed selection signal DSEL remains high, so the output selection signal SEL-OUT also remains high. The level shifter control circuit continues to enable the wide-range level shifter 2 and select its output signal LS2 as the level-shifted output signal LS-OUT.

After a time T, the integrated voltage signal INT reaches the switching point of inverter 32, and the inverted signal INV goes low. Following the propagation delay D in the delay circuit 14, the internal reset signal IRST goes high, resetting the D-type flip-flop circuit 12. The delayed selection signal DSEL is thereby reset to the low level, causing the output selection signal SEL-OUT to go low. The level shifter control circuit now disables the wide-range level shifter 2, enables the low-power level shifter 1, and selects its output signal LS1 as the level-shifted output signal LS-OUT.

When the delayed selection DSEL goes low, the output of inverter 31 goes high again, turning PMOS transistor 33 off and NMOS transistor 34 on. The integrated voltage signal INT is thus reset to the low level. With a slight delay in inverter 32, the inverted signal INV is reset to the high level. The internal reset signal IRST then goes low, leaving the level shifter control circuit ready for further VDD2 transitions.

As in the first embodiment, an interval (T+D) elapses from the fall of the switching signal SW to the rise of the internal reset signal IRST and the fall of the output selection signal SEL-OUT, allowing time (T+D−Ts) for VDD2 to reach the operating range of the low-power level shifter 1, where Ts is the interval from the switching-signal (SW) transition to the rise of the write signal WR. If the delay circuit 14 and inverter 32 are omitted, the time allowance becomes shorter (T−Ts), but in any case the time allowance is determined by the RC time constant of the integrating circuit; that is, by the resistance of the resistor 35 and the capacitance of the capacitor 36. If the resistance and capacitance are selected so as to allow sufficient time for VDD2 to reach the operating range of the low-power level shifter 1 before the low-power level shifter 1 is enabled and its output signal LS1 is selected, the hiatus B noted in FIG. 3 is eliminated.

With suitable design of the resistor 35 and capacitor 36, the second embodiment therefore provides the same effect as the first embodiment. Circuit block 5 receives a level-shifted output signal LS-OUT continuously during both the rise and fall of the VDD2 potential. Moreover, the delay time (T+D−Ts, or T−Ts) of the delayed selection signal DSEL can be set in a simple and unconstrained manner, e.g. by setting the dimensions of the resistor 35 and capacitor 36 to suitable values.

Figure 10:
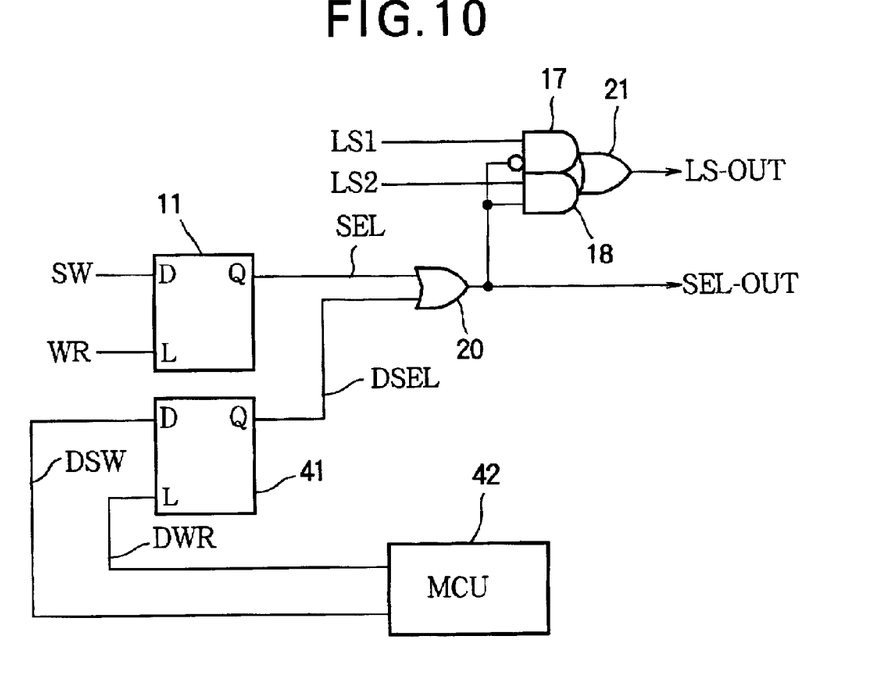
FIG. 10 is a circuit diagram of yet another level shifter control circuit embodying the invention.

As a third embodiment of the invention, FIG. 10 shows a level shifter control circuit comprising a register 11, AND gates 17, 18, OR gates 20, 21, another register 41, and a microcontroller unit (MCU) 42. Detailed descriptions of the register 11, and the AND and OR gates will be omitted, as they are identical to the corresponding elements in the preceding embodiments.

The register 41 is similar to the register 11, having a data input terminal (D), a latch clock input terminal (L), and an output terminal (Q). The data input terminal receives a delayed switching signal DSW. The latch clock input terminal receives a delayed write signal DWR. A delayed selection signal DSEL is supplied from the output terminal to OR gate 20.

The MCU 42 comprises, for example, a central processing unit and memory, the memory storing a program which is executed by the central processing unit to carry out embedded control functions in some type of electronic device. The term 'microcontroller' is often used to denote an entire integrated circuit, but the MCU 42 herein is one part of an integrated circuit that also includes the other elements in FIG. 10 and at least the level shifters 1, 2 and circuit blocks 4, 5 in FIG. 6. The MCU 42 may be part of a system on a chip, for example, or the processor core of a cell-based integrated circuit. The control functions programmed into the MCU 42 include generating the delayed switching signal DSW and delayed write signal DWR.

The timing of the delayed switching signal DSW and delayed write signal DWR determines the timing of transitions of the delayed selection signal DSEL in the same way that the timing of the switching signal SW and write signal WR determines the timing of the selection signal SEL. The MCU 42 is programmed to cause the delayed selection signal DSEL to go high while the selection signal SEL is high, and to go low a certain time T after the selection signal SEL goes low. Alternatively, the delayed selection signal DSEL goes high while the selection signal SEL is high preceding a potential reduction of power supply VDD2, and after the selection signal SEL goes low as the VDD2 potential starts to fall, the delayed selection signal DSEL goes low when VDD2 falls to a reference potential within the operating range of the low-power level shifter 1. The above time T. which is the time from a rising edge of the write signal WR coinciding with the beginning of the fall of the VDD2 potential, causing the selection signal SEL to go low, to the rising edge of the delayed write signal DWR at the high-to-low transition of the delayed selection signal DSEL, is set so as to allow sufficient time for the VDD2 potential to fall to a point within the operating range of the low-power level shifter 1. The time T is easily and freely adjustable by modification of the program of the MCU 42.

The high level of the selection signal SEL corresponds to the high level of the delayed selection signal DSEL, and the low level of the selection signal SEL corresponds to the low level of the delayed selection signal DSEL, but the timing of transitions of the delayed selection signal DSEL is the timing at which the delayed switching signal DSW is latched by the register 41 (at the rising edge of the delayed write signal DWR). The switching signal SW changes state before the rising edge of the write signal WR (before the VDD2 potential starts to change, as shown in FIG. 7); the delayed switching signal DSW likewise changes state before the rising edge of the delayed write signal DWR.

In the integrated circuit of which the MCU 42 is a part, the MCU 42 may generate the switching signal SW and write signal WR; alternatively, a power management circuit may generate these signals SW, WR on command from the MCU 42, or the MCU 42 may merely sense the timing of transitions of these signals SW, WR. The MCU 42 may also have means for sensing the potential of power supply VDD2.

The MCU 42 can accordingly by programmed to generate the delayed switching signal DSW and delayed write signal DWR, which in turn generate the delayed selection signal DSEL, on the basis of either the timing of transitions in the selection signal SEL, or the potential level of power supply VDD2. The MCU 42 generates the delayed switching signal DSW and delayed write signal DWR only at reductions in the VDD2 potential. When the potential of power supply VDD2 rises, or the potential of power supply VDD1 changes, the level shifters 1, 2 are switched according to the selection signal SEL only.

In the level shifter control circuit in FIG. 10, power supply VDD1 is 0.7 volts, and power supply VDD2 is variously 1.1 volts and five volts; the low-power level shifter 1 is selected when the VDD2 potential is 1.1 volts; the wide-range level shifter 2 is selected when the VDD2 potential is five volts. The above-mentioned reference potential with which the VDD2 potential is compared in the MCU 42 is a potential between 1.1 volts and five volts.

Before power supply VDD2 begins to fall from five volts to 1.1 volts, an event that occurs at a rising edge of the write signal WR that causes the selection signal SEL to go low, the delayed selection signal DSEL is placed at the high level by the MCU 42 and register 41. Shortly thereafter, the selection signal SEL goes low at the rising edge of the write signal WR, and the potential of power supply VDD2 begins to fall, but since the delayed selection signal DSEL is high, the output selection signal SEL-OUT is held at the high level, and the output signal LS-OUT of the level shifter control circuit in FIG. 10 remains the output signal of the wide-range level shifter 2.

When the above-mentioned time T has elapsed from the point at which the selection signal SEL goes low and the potential of power supply VDD2 begins to fall, or when the potential of power supply VDD2 falls to the above-mentioned reference potential, the delayed selection signal DSEL is brought low by the MCU 42 and register 41, so the output selection signal LS-OUT goes low, the wide-range level shifter 2 is disabled, the low-power level shifter 1 is enabled, and the output signal LS1 of the low-power level shifter 1 is selected as the output signal LS-OUT by the AND gates 17, 18 and OR gate 21.

At the time of a transition that causes the potential of power supply VDD2 to fall, the level shifter control circuit in FIG. 10 thus switches from the wide-range level shifter 2 to the low-power level shifter 1 after a time T has elapsed from the start of the potential drop of power supply VDD2 (a time sufficient for the potential of power supply VDD2 to fall to a point within the operating range of the low-power level shifter 1), or after the potential of power supply VDD2 has actually been observed to fall to a point within the operating range of the low-power level shifter 1. The hiatus B in FIG. 3 is thereby eliminated.

In the level shifter control circuit of the third embodiment, the MCU 42 and register 41 constitute a signal generating unit generating a delayed selection signal DSEL that goes high while the selection signal SEL is high preceding a transition that causes the potential of power supply VDD2 to fall, and goes low after the elapse of a time T from when the selection signal SEL goes low at this transition; alternatively, they constitute a signal generating unit generating a delayed selection signal DSEL that goes high while the selection signal SEL is high preceding a transition that causes the potential of power supply VDD2 to fall, and goes low when the potential of power supply VDD2 falls to a reference potential within the operating range of low-power level shifter 1, after the selection signal SEL goes low at this transition.

Thus in the third embodiment, a delayed selection signal DSEL is generated by the MCU 42 and register 41, and the switchover from the wide-range level shifter 2 to the low-power level shifter 1 is made when the delayed selection signal DSEL goes low. The high-to-low transition of the delayed selection signal DSEL occurs after a time T has elapsed from the high-to-low transition of the selection signal SEL that accompanies the fall of the potential of power supply VDD2; alternatively, it occurs when the potential of power supply VDD2 falls to a reference potential within the operating range of the low-power level shifter 1, after the high-to-low transition of the selection signal SEL. An uninterrupted level-shifted output signal LS-OUT is therefore obtained.

In an integrated circuit that already includes an MCU, the third embodiment can be practiced simply by adding an OR gate 20 and register 41 to the conventional level shifter control circuit, and making necessary modifications in the control program of the MCU. Fewer additional circuit elements are necessary than in the preceding embodiments.

In a variation of the third embodiment, the register 41 is incorporated into the MCU 42, as an output port of the MCU 42, for example.

Figure 11:
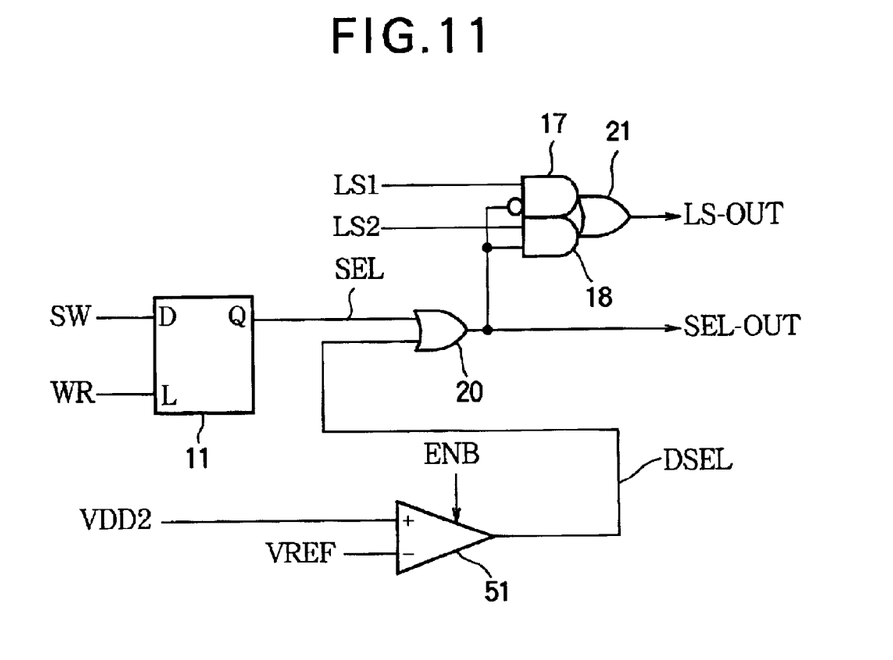
FIG. 11 is a circuit diagram of still another level shifter control circuit embodying the invention.

As a fourth embodiment of the invention, FIG. 11 shows a level shifter control circuit comprising a register 11, AND gates 17, 18, OR gates 20, 21, and a comparator circuit 51 that generates the delayed selection signal DSEL. Detailed descriptions of the register 11 and the AND and OR gates will be omitted, as they are identical to the corresponding elements in the preceding embodiments.

The comparator circuit 51 has a non-inverting (+) input terminal coupled to power supply VDD2, an inverting (−) input terminal that receives a reference potential VREF, an enable input terminal that receives an enable signal ENB, and an output terminal from which the delayed selection signal DSEL is obtained. When the enable signal ENB is high, the delayed selection signal DSEL is held low. When the enable signal ENB is low, the delayed selection signal DSEL is high if the potential of the variable power supply VDD2 is higher than the reference potential VREF, and is low if the VDD2 potential is equal to or lower than the reference potential VREF.

The enable signal ENB is, for example, identical to the switching signal SW. The reference potential VREF is set at a point within the operating range of the low-power level shifter 1, preferably at or slightly below the upper limit of this operating range.

In the level shifter control circuit in FIG. 11, power supply VDD1 is 0.7 volts, and power supply VDD2 is switched between 1.1 volts and five volts; the low-power level shifter 1 is selected when VDD2 is 1.1 volts; the wide-range level shifter 2 is selected when VDD2 is five volts. The reference potential VREF is set at a potential between 1.1 volts and five volts, within the operating range of the low-power level shifter 1.

While the switching signal SW is high and the potential of power supply VDD2 is five volts, the enable signal ENB is also high, so the delayed selection signal DSEL is low. The selection signal SEL is high, however, so the level shifter control circuit selects the wide-range level shifter 2.

When the switching signal SW goes low, indicating the impending fall of power supply VDD2, the enable signal ENB also goes low. At this moment VDD2 is still five volts, exceeding the reference potential VREF, so the delayed selection signal DSEL goes high. Soon thereafter, when VDD2 begins to fall, the write signal WR goes high and the selection signal SEL goes low, but the delayed selection signal DSEL remains high, so the output selection signal SEL-OUT remains high and the level shifter control circuit continues to select the wide-range level shifter 2.

When the potential of power supply VDD2 reaches the reference potential VREF, the delayed selection signal DSEL goes low. Since the selection signal SEL is also low, the output selection signal SEL-OUT goes low, enabling the low-power level shifter 1, and the AND gates 17, 18 and OR gate 21 select its output signal LS1 as the level-shifted output signal LS-OUT. This state persists after VDD2 settles at the 1.1-volt level.

The hiatus B noted in FIG. 3 is eliminated because the level shifter control circuit in FIG. 11 does not select the low-power level shifter 1 until the potential of power supply VDD2 is within the operating range of the low-power level shifter 1.

In the fourth embodiment, the comparator circuit 51 constitutes a signal generating unit generating a delayed selection signal DSEL that goes high while the selection signal SEL is high, before VDD2 begins to fall, and goes low after VDD2 reaches the operating-range of the low-power level shifter 1.

Thus in the fourth embodiment, a delayed selection signal DSEL is generated by the comparator circuit 51, and the switchover from the wide-range level shifter 2 to the low-power level shifter 1 is made when the delayed selection signal DSEL goes low. The high-to-low transition of the delayed selection signal DSEL occurs when the potential of power supply VDD2 falls to a reference potential within the operating range of the low-power level shifter 1, after the high-to-low transition of the selection signal SEL. An uninterrupted level-shifted output signal LS-OUT is therefore obtained.

The fourth embodiment can be implemented by adding an OR gate 20 and a comparator circuit 51 to the conventional level shifter control circuit, and providing an enable signal (which may be the switching signal SW) for the comparator circuit 51.

In a variation of the fourth embodiment, the potentials of both power supplies VDD1 and VDD2 are variable, and the signal applied to the non-inverting input terminal of the comparator circuit 51 represents the difference between them (VDD2−VDD1). The reference potential in this case is preferably equal to or slightly less than the largest potential difference (VDD2−VDD1) at which the low-power level shifter 1 can operate.

Those skilled in the art will recognize that further variations are possible within the scope claimed below.

What is claimed is:

1. A method of selecting one of a first level shifter and a second level shifter to convert a signal compatible with a first power-supply potential to a signal compatible with a second power-supply potential, the first level shifter consuming less power than the second level shifter, the method comprising:

receiving a selection signal, changes in the selection signal being accompanied by changes in the second power-supply potential;

switching from the first level shifter to the second level shifter when the selection signal changes from a first level to a second level;

setting a delayed selection signal to the second level while the selection signal is at the second level, before the second power-supply potential begins to change;

setting the delayed selection signal to the first level after the selection signal has changed to the first level and the second power-supply potential has begun to change; and selecting the first level shifter according to the delayed selection signal.

2. A level shifter control circuit receiving a selection signal and selecting one of a first level shifter and a second level shifter to convert a signal compatible with a first power-supply potential to a signal compatible with a second power-supply potential, the first level shifter consuming less power than the second level shifter, comprising:

a signal generating unit generating a delayed selection signal that goes from a first level to a second level while the selection signal is at the second level, and goes to the first level when a predetermined time has elapsed after the selection signal changes from the second level to the first level; and a selection unit that switches over from the first level shifter to the second level shifter when the selection signal changes from the first level to the second level, and switches over from the second level shifter to the first level shifter when the delayed selection signal changes from the second level to the first level.

3. The level shifter control circuit of claim 2, wherein the signal generating unit comprises:

a resettable flip-flop circuit generating the delayed selection signal as an output signal, the delayed selection signal being set to the first level when the resettable flip-flop circuit is reset, and being set to the second level before the selection signal changes from the second level to the first level;

a counter that starts counting when the delayed selection signal changes from the first level to the second level; and a reset circuit for resetting the resettable flip-flop circuit and the counter when the counter reaches a predetermined count.

4. The level shifter control circuit of claim 3, wherein the reset circuit includes a delay element that delays the resetting of the resettable flip-flop circuit and the counter by a predetermined amount after the counter reaches the predetermined count.

5. The level shifter control circuit of claim 2, wherein the signal generating unit comprises:

a resettable flip-flop circuit generating the delayed selection signal as an output signal, the delayed selection signal being set to the first level when the resettable flip-flop circuit is reset, and being set to the second level before the selection signal changes from the second level to the first level;

an integrating circuit generating an integrated voltage signal, integration starting when the delayed selection signal changes from the first level to the second level; and a reset circuit for resetting the resettable flip-flop circuit and the integrating circuit when the integrated voltage signal reaches a predetermined level.

6. The level shifter control circuit of claim 5, wherein the reset circuit includes a delay element that delays the resetting of the resettable flip-flop circuit and the integrating circuit by a predetermined amount after the integrated voltage signal reaches the predetermined level.

7. The level shifter control circuit of claim 2, wherein the signal generating unit includes a microcontroller unit that senses changes in the selection signal.

8. The level shifter control circuit of claim 2, wherein:

changes in the selection signal are accompanied by changes in the second power-supply potential;

when the selection signal changes from the second level to the first level, the signal generating unit brings the delayed selection signal to the second level before the second power-supply potential starts its accompanying change; and the signal generating unit changes the delayed selection signal from the second level to the first level after the second power-supply potential starts its accompanying change.

9. A level shifter control circuit receiving a selection signal and selecting one of a first level shifter and a second level shifter to convert a signal compatible with a first power-supply potential to a signal compatible with a second power-supply potential, the first level shifter consuming less power than the second level shifter, changes in the selection signal being accompanied by changes in the second power-supply potential, the level shifter control circuit switches over from the first level shifter to the second level shifter when the selection signal changes from a first level to a second level, and the level shifter control circuit comprising:

a signal generating unit generating a delayed selection signal that goes to the second level while the selection signal is at the second level, and goes to the first level after the selection signal changes to the first level, when the second power-supply potential reaches a predetermined value; and a selection unit that switches over from the first level shifter to the second level shifter when the selection signal changes from the first level to the second level, and switches over from the second level shifter to the first level shifter when the delayed selection signal changes from the second level to the first level.

10. The level shifter control circuit of claim 9, wherein the signal generating unit comprises a microcontroller unit that senses the second power-supply potential.

11. The level shifter control circuit of claim 9, wherein the signal generating unit comprises a comparator that compares the second power-supply potential with a reference potential having said predetermined value.

* * * * *